United States Patent [19]

Seo et al.

[11] Patent Number: 5,740,956
[45] Date of Patent: Apr. 21, 1998

[54] BONDING METHOD FOR SEMICONDUCTOR CHIPS

[75] Inventors: Seong Min Seo; Suck Ju Jang, both of Seoul, Rep. of Korea

[73] Assignees: Anam Industrial Co., Ltd., Seoul, Rep. of Korea; Amkor Electronics, Inc., Chandler, Ariz.

[21] Appl. No.: 570,849

[22] Filed: Dec. 12, 1995

[30] Foreign Application Priority Data

Sep. 4, 1995 [KR] Rep. of Korea ............... 95-28772

[51] Int. Cl.$^6$ ..................................... H01L 21/60
[52] U.S. Cl. .................. 228/180.22; 228/254; 438/617
[58] Field of Search ..................... 228/180.5, 254, 228/180.22; 437/183; 29/879; 438/617

[56] References Cited

U.S. PATENT DOCUMENTS

| | | | |
|---|---|---|---|
| 4,674,671 | 6/1987 | Fister et al. | 228/180.5 |
| 4,875,618 | 10/1989 | Hasegawa et al. | 228/180.5 |
| 5,439,162 | 8/1995 | George et al. | 228/254 |
| 5,497,545 | 3/1996 | Watanabe et al. | 228/254 |

FOREIGN PATENT DOCUMENTS

| | | | |
|---|---|---|---|
| 2215140 | 8/1990 | Japan | 228/180.5 |
| 414845 | 1/1992 | Japan | 228/180.5 |
| 94-1149 | 2/1994 | Rep. of Korea . | |

*Primary Examiner*—Samuel M. Heinrich
*Attorney, Agent, or Firm*—Skjerven Morrill MacPherson Franklin & Friel; Thomas S. MacDonald

[57] ABSTRACT

This invention is related to providing a bonding method for flip chips in which the circuit part is oriented to be face-down on a substrate after bonding bumps are formed on the semiconductor chip namely, forming Au bumps by Au wire ball bonding employing a wire ball bonding device onto aluminum bond pads of the semiconductor chips; coating the Au bumps with Sn/Pb alloy bumps also by wire ball bonding using a wire ball bonding device; with or without re-forming the Sn/Pb alloy bumps into a desired ball-shape by performing a heat treatment in a furnace after an activation solvent is applied to the Sn/Pb alloy bumps; and bonding (by the heat treatment in the furnace) the substrate to the coated bumps containing chip by a heat treatment in the furnace.

5 Claims, 3 Drawing Sheets

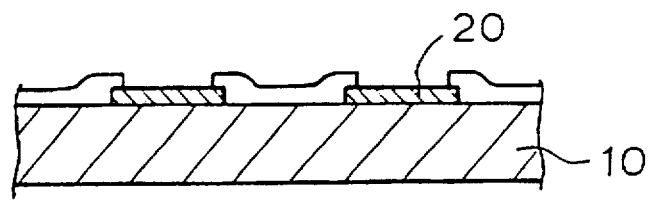
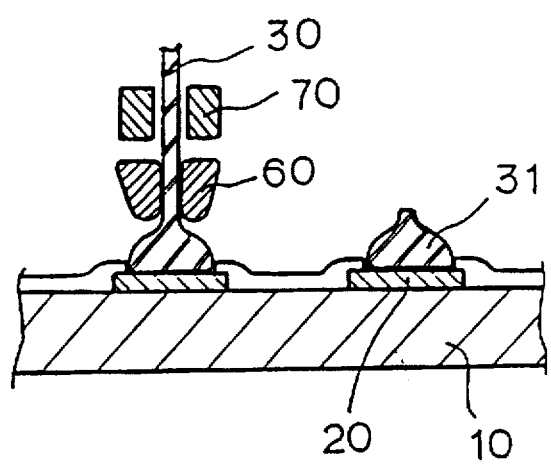
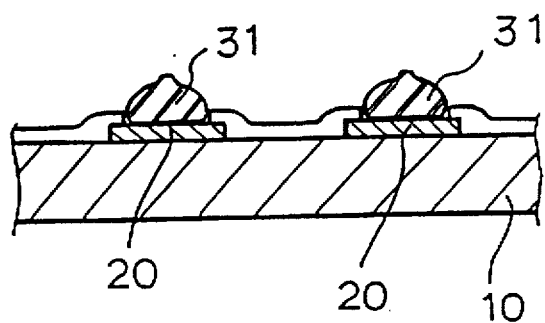

BONDING METHOD FOR SEMICONDUCTOR CHIPS

BACKGROUND OF THE INVENTION

1. Field of the Invention

This invention is related to a bonding method for semiconductor chips, and more specifically to a bonding method for flip chip in which a circuit part is oriented to be face-down on a substrate after bumps are formed on a semiconductor chip.

2. Description of the Prior Art

In the general bonding method for the flip chips, bumps which are used to bond a chip with a substrate, are directly formed in the desired shape on aluminum pads of the chips, in a specific step of the process for manufacturing the semiconductor chips, and then the semiconductor chips is adhered to the substrate.

As shown in FIG. 1A–1E, the above bonding method comprises steps as follows: 1B—arranging molybdenum (Mo) masks 3 so that the bumps are arranged above the aluminum bond pads 2 on the semiconductor chip 1; 1C—evaporating layers of Cr/Cu/Au 4 on the aluminum bond pads; 1D—forming the bumps by evaporating Sn/Pb layers 5 on the layers of Cr/Cu/Au 4; 1E—removing the molybdenum (Mo) masks 3 in the above step; and forming the bumps 6 of the desired shape by re-forming the layers of Sn/Pb 5.

However, the forming method for the bumps has some problems as follows: the process is very complex, manufacturing cost is too expensive, a long manufacturing time is needed; and the work must be performed in a specific step of the manufacturing process.

It also is known to use other bonding methods for semiconductor chips comprising the following steps as shown in Korean Patent Publication No 94-1149, namely: forming the first Au balls, utilizing Au wire ball bonding employing a wire ball bonding device, onto the electrodes of the chip; stacking a set of second Au balls, also utilizing Au wire ball bonding, onto the first Au balls; forming a set of Pb balls, utilizing Pb wire ball bonding employing a wire ball bonding device, onto the second Au balls; and bonding the chip to the substrate during melting of the Pb balls by applying heat to the Pb balls.

However, this latter bonding method for the semiconductor chips has some problems. Firstly, since the first Au balls, the second Au balls and the Pb balls stack only in order, the adhesive strength with the aluminum bond pad on the semiconductor chip is reduced resulting in an increase in the rate of bad products. Second, since the Au balls are formed in two layers, the aluminum bond pads are subjected to damage in accordance with an overload. Lastly, since the waste of materials is extremely high, the unit cost of production is increased.

SUMMARY OF THE INVENTION

In the light of the foregoing problems, the present invention has an object to provide a bonding method for the semiconductor chips, in which the bumps are formed by a wire ball bonding device in the manufacturing process so that the efficiency of the chip bonding is improved, so that the size of the bumps can be regulated in accordance with the thickness of the wires utilized in the bonding device, and in which the bumps can be formed quickly and exactly so that the process cost is reduced along with reduction in the waste of the materials.

To attain the object described above according to this invention, there is provided a bonding method for the semiconductor chips comprising:

- a step for forming the Au bumps, by Au wire ball bonding by employing a wire ball bonding device above the aluminum bond pads, onto the semiconductor chip;
- a step for wrapping, i.e. coating the outer surface of the Au bumps with Sn/Pb alloy bumps by Sn/Pb alloy wire ball bonding by a wire ball bonding device;
- a step for re-forming in the desired ball-shape by heat treatment in a furnace after an activation solvent is applied to the Sn/Pb alloy bumps;
- a step for bonding, by heat treatment in a furnace, of a substrate and the chip ball bumps after an activation solvent is applied to the substrate, the ball bumps being re-formed by the step for bonding by heat treatment in the furnace, the Sn/Pb alloy bumps having enclosing the Au bumps without the re-forming step.

BRIEF DESCRIPTION OF THE DRAWINGS

The invention will now be described in detail with reference to the attached drawings, in which.

DETAILED DESCRIPTION OF THE PREFERRED EMBODIMENT

Figure 1A:
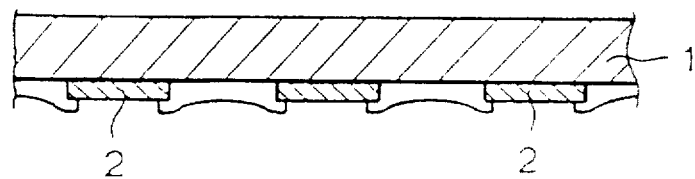
FIG. 1 is a series A–E of side views showing the prior manufacturing method steps for the bumps.
Figure 1B:
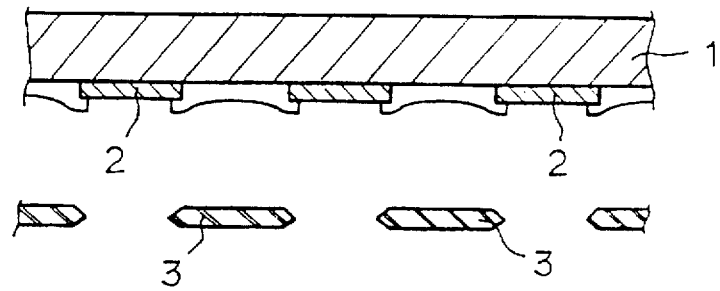
Figure 1C:
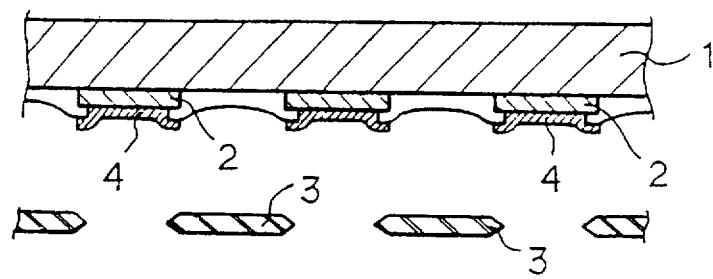
Figure 1D:
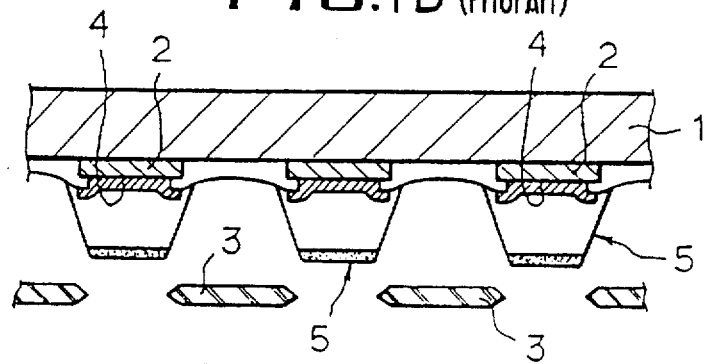
Figure 1E:
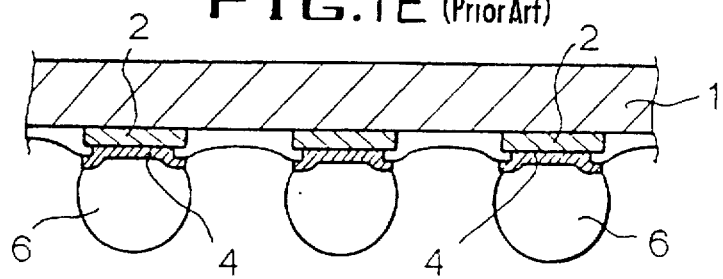
Figure 2D:
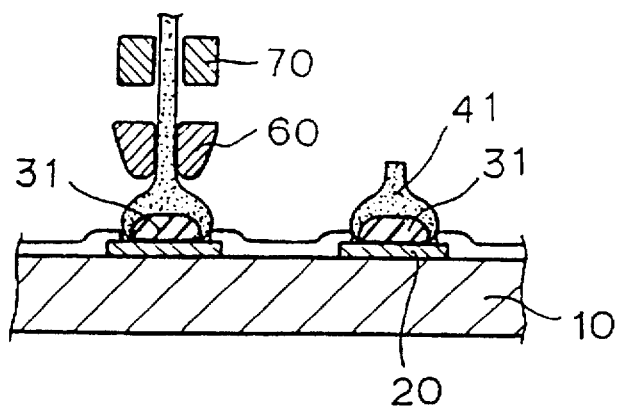
FIG. 2 is a series A–G of side view showing the bonding method for semiconductor chips in accordance with the present invention.
Figure 2E:
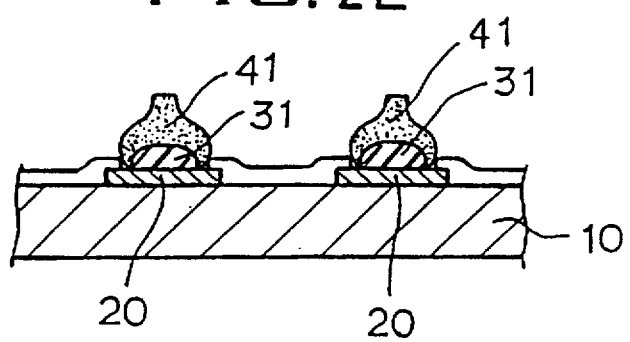
Figure 2F:
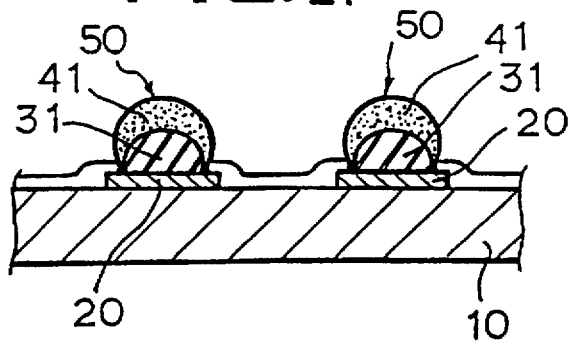
Figure 2G:
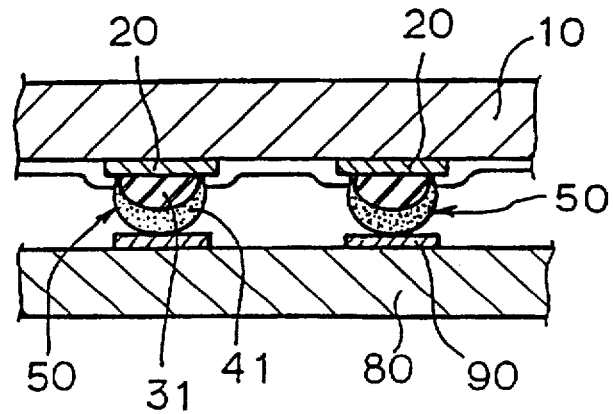

As shown in FIG. 2, the bonding method for the semiconductor chips in accordance with the present invention comprises steps as follows:

- a step FIG. 2B for forming Au bumps 31 comprising cutting wires in the upper parts of Au balls adhered by wire clamps 70 while the Au balls are adhered onto aluminum bond pads 20, after the balls are formed by passing Au wires 30 in the capillaries 60 of a prior art wire ball bonding device resulting in the structure in FIG. 2C;
- a step FIG. 2D for wrapping, i.e. coating or overlying, the Au bumps 31 with Sn/Pb alloy bumps 41 by stacking the Sn/Pb alloy bumps 41 which are better than Au in ductility onto said Au bumps 31, by the wire ball bonding device 60, 70 in which a gas mixture of $H_2$—Ar or $H_2$—$N_2$ is supplied; and
- a step FIG. 2G for bonding, by heat treatment in a furnace, a face-down semiconductor chip 10 having the Sn/Pb alloy bumps 41 which wrap (coat) the Au bumps 31, after activation solvent is applied to the substrate, to a lead finger 90 of a substrate 80.

Furthermore, by adding a step FIG. 2F for re-forming between the step for wrapping and the step for bonding, said bonding method for the semiconductor chips may comprise steps as follows:

- a step FIG. 2D for forming Au bumps 31 comprising cutting wires in the upper parts of the Au balls adhered by wire clamps 70 while the Au balls are adhered onto aluminum bond pads 20, after the balls are formed by passing Au wires 30 through the capillaries 60 of the prior art wire ball bonding device;
- a step FIG. 2E for wrapping, i.e. coating the Au bumps 31 with the Sn/Pb alloy bumps 41 by stacking the Sn/Pb alloy bumps 41 which are better than Au in ductility, onto the Au bumps 31, by the wire ball bonding device in which the gas mixture or H$_2$—Ar or H$_2$—N$_2$ is supplied;

a step FIG. 2F for re-forming the bumps 50 in the desired shape by performing the heat treatment in the furnace, after the activation solvent is applied to the surface of the Sn/Pb alloy bumps 41; and a step FIG. 2G for bonding, by heat treatment in the furnace, a face-down semiconductor chip 10 having the ball bumps re-formed by the re-forming step, after activation solvent is applied to the solvent is applied to the substrate, to lead finger 90 of substrate 80.

The Au wires 30 used when the Au bumps 31 are formed by the wire ball bonding device, are preferred to contain palladium of 0.5–3.0 weight %, whereby the shape and the tail of the Au bumps 31 can be most uniform. The outer surface of the Au bumps 31 is fully wrapped or coated with the Sn/Pb alloy bumps 41 so that the Sn/Pb alloy bumps 41 are preferably adhered to the aluminum bond pads 20.

In order to easily stack the Sn/Pb alloy bumps 41 onto the Au bumps 31, the cuttes parts of the Au bumps 31 (FIG. 2C) may be cut off or are made flatter by pressing-down with capillaries having the flatting ends (FIG. 2B), and optionally are formed to a desired length. Moreover, the ends of the Au bumps 31 may be formed in the shape of a circular arc as shown in FIGS. 2D–2F.

When the Au bumps 31 are coated with the Sn/Pb alloy bumps 41 in an atmosphere of the gas mixture of H$_2$—Ar or H$_2$—N$_2$, oxidation is prevented on the outer surface of the Sn/Pb alloy bumps 41.

In accordance with the present invention, the Au bumps are formed above the aluminum bond pads 20 onto the semiconductor chip 10. The Sn/Pb alloy bump 41 is formed to wrap the Au bumps 31. The bonding between the chip 10 and substrate 80 is completed by passing the assembly through a furnace, after an activation solvent is applied to the substrate 80 and then the chip is arranged on the substrate by face-down.

In accordance with the present invention, the bumps 50 are formed by using a prior art wire ball bonding device utilized to the semiconductor manufacturing process, whereby the efficiency of the chip bonding is improved. Since the Au bumps 31 containing Pd of 0.5–3.0 weight % are fully wrapped or coated with the Sn/Pb alloy bumps 41, the contact area is wide, whereby the rate of bad product can be reduced.

In accordance with the present bonding method for the bonding semiconductor chips, the prior art complex bumps manufacturing process of FIG. 1 obviated. Owing to use of a wire ball bonding device in a semiconductor manufacturing method, the bump size can be regulated in accordance with the thickness of the wire. Moreover, owing to the formation of the bumps by a simple process, it is effective that the unit cost of production is reduced and yield is increased in accordance with the simplified process of the invention.

What is claimed is:

1. A bonding method for connecting a semiconductor chip having aluminum bond pads to a substrate having a series of lead fingers comprising:

providing a wire ball bonding device;

forming Au bumps by Au wire ball bonding employing the wire ball bonding device onto the aluminum bond pads of the semiconductor chip;

then coating fully an outer surface of the Au bumps with Sn/Pb alloy bumps in an atmosphere of a gas mixture of H$_2$—Ar or H$_2$—N$_2$, by stacking said Sn/Pb alloy bumps onto said Au bumps by the wire ball bonding device, the resultant Sn/Pb coating having portions adhered to the aluminum bond pads; and bonding the substrate to the semiconductor chip having said Sn/Pb alloy bumps which coat said Au bumps, said coated Au bumps being oriented face-down on the lead fingers of the substrate.

2. The bonding method of claim 1, following said coating step further comprising re-forming said Sn/Pb alloy bumps in a desired ball-shape by performing a heat treatment in a furnace.

3. The bonding method of claim 1 or 2, in which the Au wire which is formed to said Au bumps, contains Pd of 0.5–3.0 weight %.

4. The bonding method of claim 1 or 2, further comprising cutting off parts of said Au bumps to make shortened Au bumps, or by pressing-down said Au bumps with a capillary of the wire ball bonding device having flatting ends.

5. The bonding method of claim 1 or 2, further comprising cutting off parts of said Au bumps and forming said cut-off Au bumps in the shape of a circular arc.

* * * * *